(12) United States Patent
Hiller

(10) Patent No.: US 8,973,377 B2
(45) Date of Patent: Mar. 10, 2015

(54) THERMOELECTRIC POWER GENERATION USING AIRCRAFT FUSELAGE TEMPERATURE DIFFERENTIAL

(75) Inventor: Nathan D. Hiller, Irvine, CA (US)

(73) Assignee: The Boeing Company, Chicago, IL (US)

( * ) Notice: Subject to any disclaimer, the term of this patent is extended or adjusted under 35 U.S.C. 154(b) by 168 days.

(21) Appl. No.: 13/467,434

(22) Filed: May 9, 2012

(65) Prior Publication Data

US 2013/0298956 A1    Nov. 14, 2013

(51) Int. Cl.
  *F25B 21/02*    (2006.01)
(52) U.S. Cl.
  USPC .................................. 62/3.2; 62/3.61; 62/414
(58) Field of Classification Search
  CPC .................................. F25B 21/00; F25B 21/04
  USPC ............ 62/3.2, 3.61, 414; 136/205, 212, 200, 136/230; 244/58, 119
  See application file for complete search history.

(56) References Cited

U.S. PATENT DOCUMENTS

| | | | |
|---|---|---|---|
| 5,554,819 A * | 9/1996 | Baghai-Kermani | .......... 136/206 |
| 6,914,343 B2 | 7/2005 | Hiller et al. | |
| 7,012,554 B2 | 3/2006 | Hiller et al. | |
| 7,649,138 B2 | 1/2010 | Hiller et al. | |
| 8,294,020 B2 * | 10/2012 | Mitchell et al. | ................ 136/200 |
| 2006/0151021 A1 * | 7/2006 | Stark | ............................. 136/205 |
| 2006/0242888 A1 * | 11/2006 | Bedoukian | ...................... 43/107 |
| 2006/0266402 A1 * | 11/2006 | Zhang et al. | .................. 136/205 |
| 2008/0006036 A1 * | 1/2008 | Askew | ............................. 62/3.3 |
| 2008/0135081 A1 | 6/2008 | Sharifi et al. | |
| 2008/0150396 A1 * | 6/2008 | Clingman et al. | ............. 310/331 |
| 2008/0230653 A1 | 9/2008 | Michell | |

FOREIGN PATENT DOCUMENTS

| | | |
|---|---|---|
| FR | 2947529 A1 | 1/2011 |
| GB | 2447333 A | 9/2008 |
| WO | 2010128241 A2 | 11/2010 |

\* cited by examiner

*Primary Examiner* — Mohammad M Ali
(74) *Attorney, Agent, or Firm* — Felix L. Fischer

(57) ABSTRACT

An electric power generation system employs a thermoelectric generator placed between an aircraft inner skin and an aircraft outer skin. The thermoelectric generator is configured to utilize a thermal differential between the inner and outer skin to generate electricity. An electrical interface is provided for access to the electricity generated by said thermoelectric generator.

8 Claims, 6 Drawing Sheets

THERMOELECTRIC POWER GENERATION USING AIRCRAFT FUSELAGE TEMPERATURE DIFFERENTIAL

BACKGROUND INFORMATION

1. Field

Embodiments of the disclosure relate generally to the field of electrical power generation for aircraft and more particularly to a system employing a thermoelectric generator engaged between aircraft interior and exterior surfaces for generation of electricity using temperature differential between the surfaces.

2. Background

Modern aircraft employ electrical power for numerous on board systems. Conventional generation of electricity for such usage is accomplished with engine or auxiliary power unit (APU) driven generators located in the aircraft. Power from the generators is then routed through the aircraft for use with standard electrical cabling in numerous wire harnesses. Issues of weight for the extensive wiring systems as well as the potential for undesirable electrical discharge within the circuit system have prompted examination of alternative power routing techniques.

As an example, a system that uses a laser powered by the conventional centralized generation system to inject power in the form of light into a fiber optic cable and a photovoltaic (PV) array to convert the light back into electricity for powering devices has been developed. This system avoids the issues associated with undesirable electrical discharge in the power distribution system but still results in significant weight in the aircraft since fiber optic cables must replace the conventional wiring harnesses throughout the aircraft. Additionally, the amount of power the laser optical system can produce and transmit is limited.

It is therefore desirable to provide an electrical generation system which is distributed to avoid extensive wiring harnesses and which is efficient, low-maintenance, robust, reliable, solid-state and yet providing sufficient power for operation of selected aircraft systems.

SUMMARY

Embodiments disclosed herein provide an electric generator which employs a thermoelectric generator placed between an aircraft inner skin and an aircraft outer skin. The thermoelectric generator is configured to utilize a thermal differential between the inner and outer skin to generate electricity. An electrical interface is provided for access to the electricity generated by said thermoelectric generator.

For the exemplary aircraft embodiments, the inner skin and outer skin are on the fuselage of the aircraft and the aircraft is operated at altitudes providing a temperature differential between the outer skin and inner skin warmed by heated cabin air.

The embodiments provide a method for generating electrical power for use by a device on an aircraft through positioning a thermoelectric generator between an inner skin and an outer skin of an aircraft. Cabin air proximate the inner skin is heated at operating altitudes to maintain the temperature differential between the inner skin and outer skin. Electricity is then generated using the thermoelectric generator based on a temperature differential between the inner skin and the outer skin. The generated electricity may then be used to at least partially power the device.

The features, functions, and advantages that have been discussed can be achieved independently in various embodiments of the present disclosure or may be combined in yet other embodiments further details of which can be seen with reference to the following description and drawings.

DETAILED DESCRIPTION

Embodiments disclosed herein provide electrical power for a device using a thermoelectric generator located near the receiving device. The thermoelectric generator is able to produce electrical power using the potential energy that exists between the warm cabin air of the aircraft and the external cold air at cruising altitudes.

A descriptor for the embodiments has been coined as "Electricity Over Air (EOA)" because the thermoelectric generator employs the temperature differential of the cabin air in order to make electricity. To maintain passenger comfort, the cabin air must be kept warm. Since aircraft warm the cabin air by circulation throughout the cabin using natural and/or forced convection, the power consuming device is essentially receiving its electrical power through the air.

Commercial aircraft cruise at altitudes above the tropopause and extending well into the stratosphere. Air temperatures in this region of the atmosphere are nominally between −20° and −60° C. Operating altitudes even during climb and descent regularly provide significantly cooler air temperatures.

Figure 1:
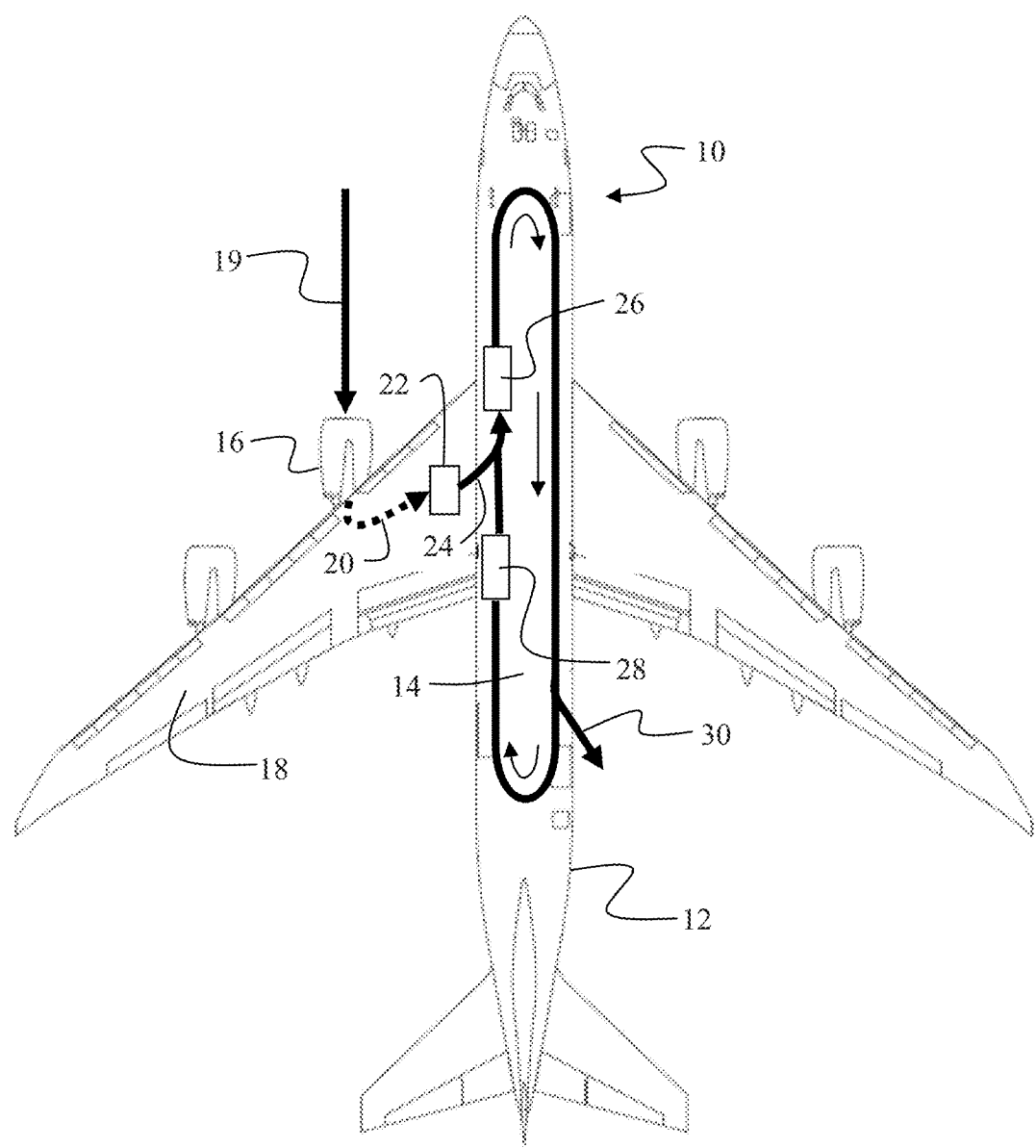
FIG. 1 is a top schematic view of an aircraft with cabin air conditioning.

As shown in FIG. 1 for an exemplary aircraft system, the aircraft 10 has a fuselage 12 encompassing the cabin 14. Engines 16 (shown as mounted on the wings 18 for the present example but mounted on the empennage of the aircraft in alternative configurations) include a compressor section which receives incoming air (shown as element 19) and provides hot bleed air (shown as element 20) to an air conditioning system 22 that employs heat exchangers to appropriately heat incoming cabin air (shown as element 24) which is then routed into the cabin 14 through appropriate ducting to a mixing manifold 26 where it is mixed in an approximate 50/50 ratio with existing cabin air which has been cleaned by routing through one or more high efficiency air filtration systems 28. An exiting air volume (shown as element 30)

equal to the incoming cabin air volume is discharged from the fuselage 12 through one or more exit ducts. Cabin air is maintained at operating altitudes including cruise at temperatures of approximately +20° C.

Figure 2:
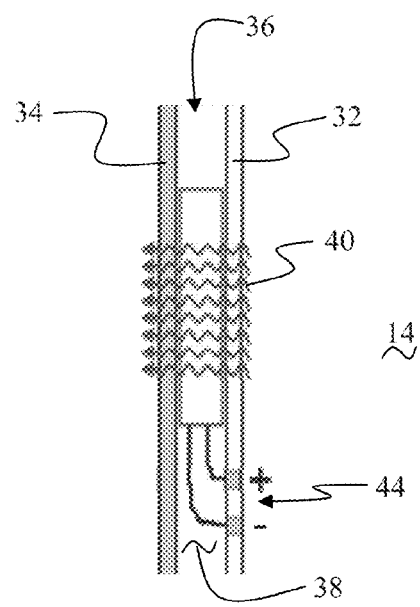
FIG. 2 is a front section view of a fuselage wall with inner and outer skins and a thermoelectric generator.

As shown in FIG. 2, the aircraft fuselage 12 is typically constructed with an inner skin 32 and an outer skin 34 for both structural and insulation considerations. A thermoelectric generator 36 is placed in the intermediate volume 38 between the inner and outer skins. Such thermoelectric generators can be placed at multiple locations through the fuselage 12. Heat, represented by arrows 40, is transmitted through the thermoelectric generator 36 from the cabin 14 to the external air mass 42. Electrical power generated by the thermoelectric generator 36 is then provided to an outlet 44.

Figure 3:
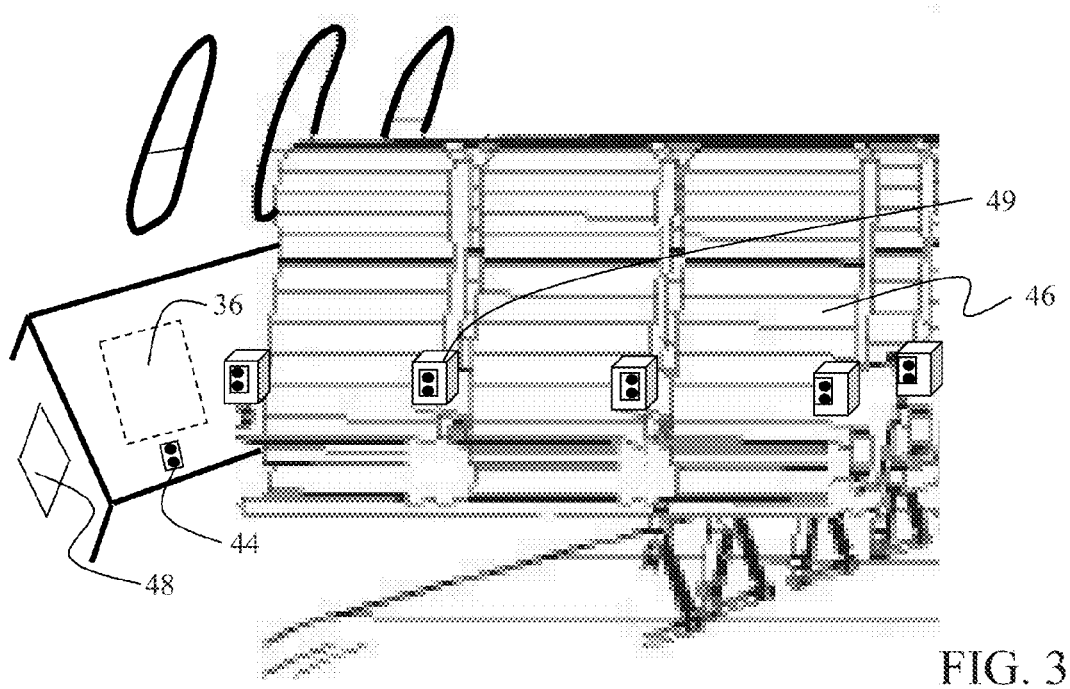
FIG. 3 is a cabin interior pictorial view showing the thermoelectric generator generalized location and operating devices to be powered.

As shown in FIG. 3, the thermoelectric generator 36 is located immediately adjacent the desired usage location such as passenger seating 46 where it may be employed for personal devices of the passenger, operation of current seat mounted devices such as television displays 48, music system indicators 49, or seat lighting systems (not shown). While shown for the described example as providing power for passenger compartment devices, the thermoelectric generators 36 may be placed in alternative locations for powering of galley equipment or other electrical systems in the aircraft.

Figure 4A:
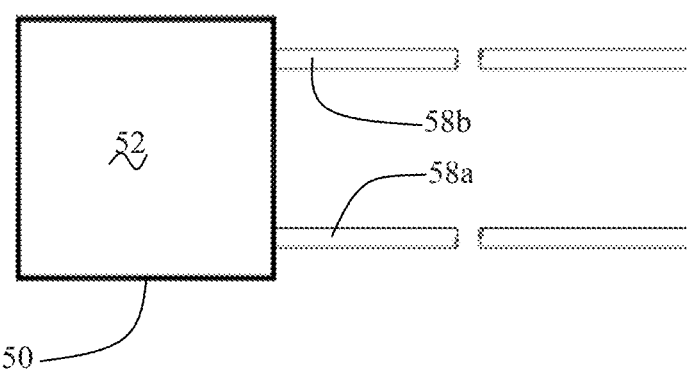
FIG. 4A is a side view of an example thermoelectric generator operating element.
Figure 4B:
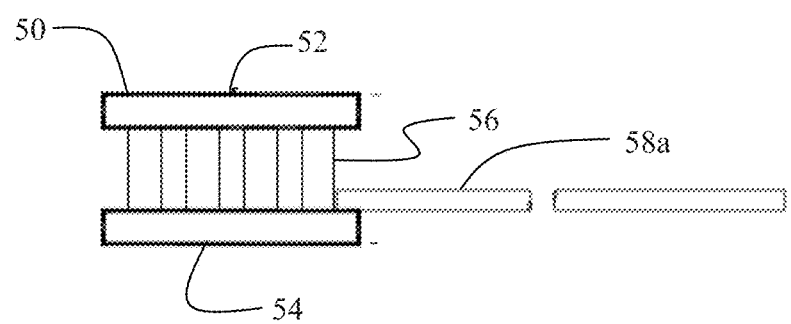
FIG. 4B is a top view of the operating element of FIG. 4A.

The operating elements 50 of the thermoelectric generator 36 as shown in FIGS. 4A and 4B employ a cold plate 52 and a hot plate 54 fabricated from alumina ceramic or similar material which may be metalized. The hot plate 52 and cold plate 54 are mounted on opposite sides of a thermoelectric stack 56 fabricated from bismuth telluride (Bi2Te3) semiconductor p-n junctions. Electrical power generated by the stack 56 is then provided through leads 58a and 58b. For an exemplary embodiment, a thermoelectric generator 36 may be created using one or an array of single stage operating elements 50 such as the model NL1010T produced by Marlow Industries Inc., Dallas, Tex. The hot and cold plates 52, 54 are thermally interfaced to the inner and outer skins 32, 44 either directly or on conductive extensions using thermal grease such as that produced by Marlow Industries with part no. #860-3079-001 for optimal thermal conductivity. The cold plate 52 conductively engages the outer skin for heat transfer and the hot plate 54 interacts with the heated cabin air either through direct conductive engagement of the inner skin 32 with natural convective heat transfer from the cabin air to the inner skin or with heat exchange elements for natural or forced convection.

Figure 5:
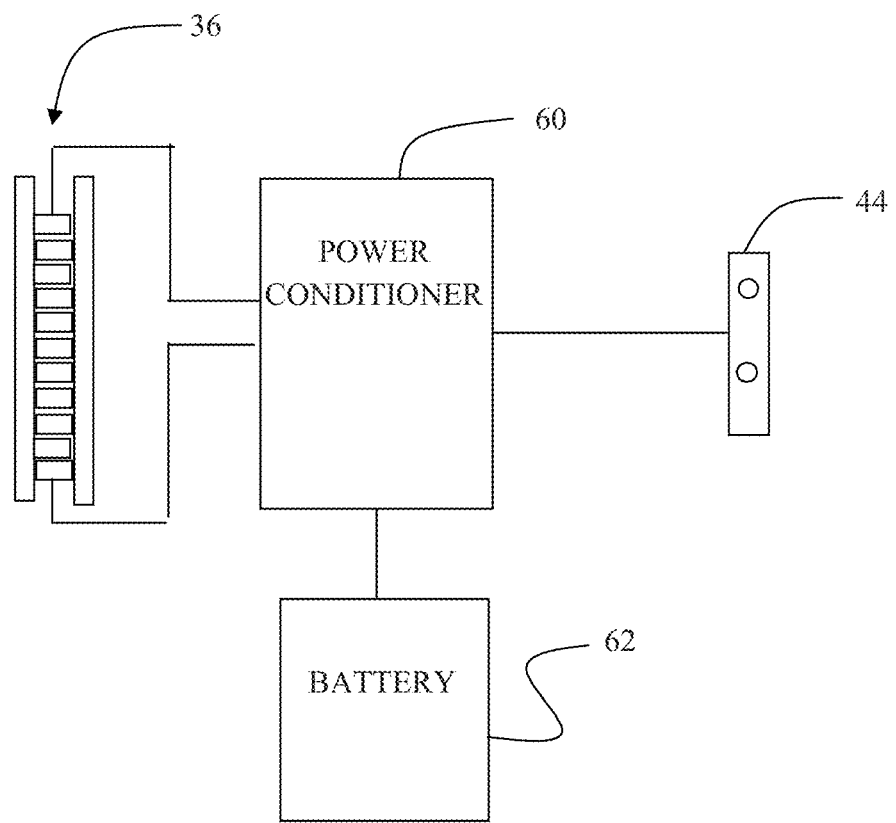
FIG. 5 is a block diagram of the thermoelectric generator with power conditioning, battery and outlet.

As shown in FIG. 5, the thermoelectric generator 36 provides generated power to a power conditioning module 60 which converts the generator output to desired current and voltage values (such as 12 volt or 28 volt DC or 110 volt AC) for the operating devices at the outlet 44. A battery 62 is connected to the generator through the power conditioning system for power storage to allow usage of the powered devices when thermal gradients may not be present for operation of the thermal generator 36 or to supplement the power provided by the thermal generator when the temperature differential is small.

Figure 6A:
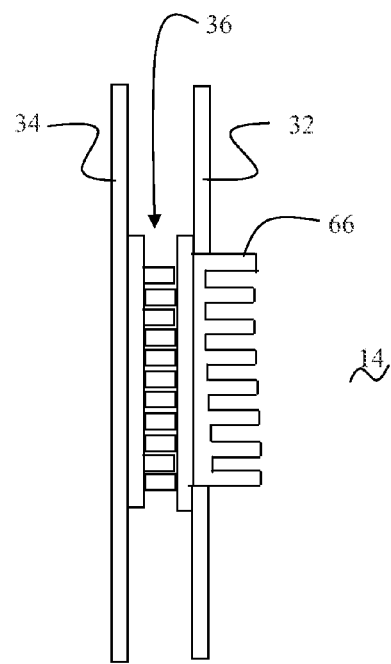
FIG. 6A is a front section view of the fuselage skins with the thermoelectric generator incorporating a finned heat exchanger.
Figure 6B:
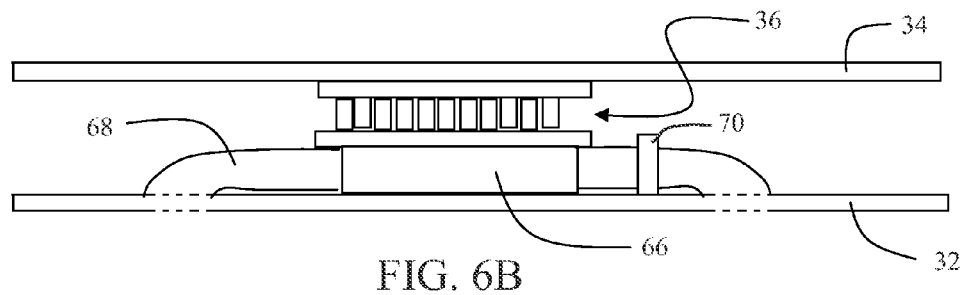
FIG. 6B is a top section view of the fuselage skins with the finned heat exchanger ducted for forced convection with a fan.
Figure 6C:
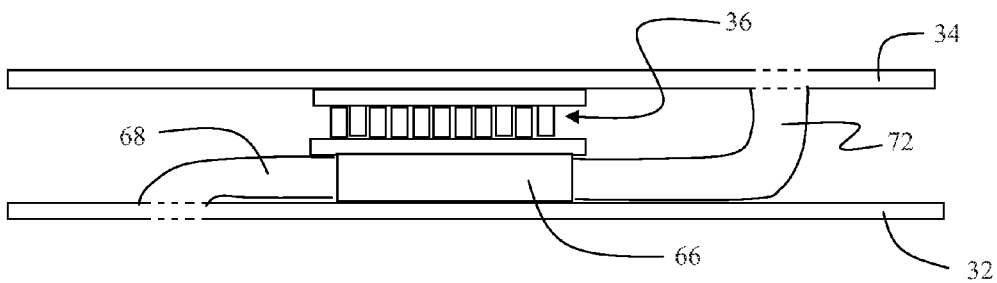
FIG. 6C is a top section view of the fuselage skins the finned heat exchanger ducted for forced convention using pressure differential; and, FIG. 7 is a flow chart of operation of the thermoelectric generator for distributed generation of power for on board device use.

The configuration of the thermoelectric generator 36 may incorporate a direct conductive connection to the inner and outer skins of the fuselage as shown in FIG. 2 which relies on natural convective heat transfer between the inner skin and the warm air of the cabin. In alternative configurations, the thermoelectric generator 36 may incorporate a finned heat exchanger 66 as shown in FIG. 6A which either extends into the aircraft cabin 14 on the interior of inner skin 32 to enhance natural convective heat transfer into the thermoelectric generator or is incorporated in a duct 68 which employs a fan 70 interconnected to receive cabin air and directing flow across the finned heat exchanger 66 for forced convective heat transfer as shown in FIG. 6B. In a further alternative configuration, the duct 68 may be included as a portion of the cabin air exit duct 72 as shown in FIG. 6C to utilize pressure differential between the pressurized cabin and exterior pressure at altitude to create airflow for forced convective heat transfer to the heat exchanger.

Figure 7:
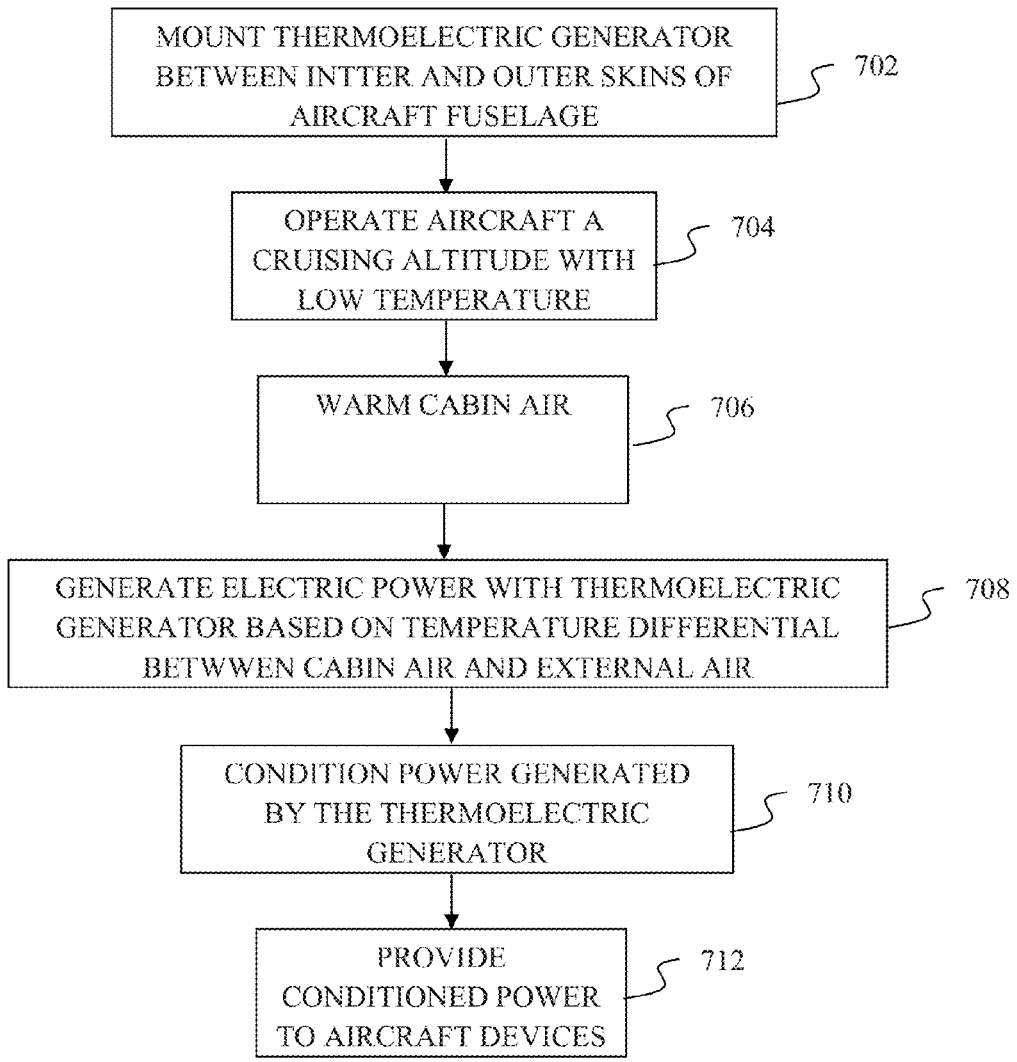

The embodiments disclosed provide a method for generation of electrical power on an aircraft as shown in FIG. 7. A thermoelectric generator is mounted between the inner and outer skins of an aircraft fuselage, step 702. The aircraft is then operated at a cruising altitude providing a low temperature external to the fuselage, step 704. The cabin air within the fuselage is warmed using engine bleed air, step 706. Electrical power is then generated by the thermoelectric generator through the temperature differential between the cabin air acting on the inner skin at cabin temperature and external air acting on the outer skin at external temperature, step 708. As previously described, the differential temperature may be employed by the thermoelectric generator using natural convection or forced convection. The forced convection may be induced using a fan or relying on pressure differential between the cabin and external air. Power generated by the thermoelectric generator can then be conditioned for proper voltage, step 710, and provided to devices in the aircraft for power usage, step 712.

Having now described various embodiments of the disclosure in detail as required by the patent statutes, those skilled in the art will recognize modifications and substitutions to the specific embodiments disclosed herein. Such modifications are within the scope and intent of the present disclosure as defined in the following claims.

What is claimed is:

1. An electric generator comprising:
   a thermoelectric generator placed between an aircraft inner skin and an aircraft outer skin, said thermoelectric generator incorporating at least one operating element having
   a cold plate for thermal engagement of the outer skin and
   a hot plate for thermal interaction with warmed cabin air internal to the inner skin; and,
   a thermoelectric stack of bismuth telluride (Bi2Te3) semiconductor p-n junctions intermediate the cold plate and hot plate for electrical power generation;
   said thermoelectric generator further configured to utilize a thermal differential between the inner and outer skin to generate electricity; and,
   an electrical interface for providing access to the electricity generated by said thermoelectric generator;
   a heat exchanger in conductive connection with the hot plate and wherein the thermal interaction by the hot plate comprises natural convection of cabin air through the heat exchanger;
   a duct extending from the inner skin providing airflow from the cabin and an exit duct for flow through the outer skin through the duct and wherein the thermal interaction by the hot plate comprises forced convection of cabin air through the heat exchanger employing pressure differential.

2. The electric generator as defined in claim 1 further comprising a fan providing airflow from the cabin through the duct and wherein the thermal interaction by the hot plate comprises forced convection of cabin air through the heat exchanger.

3. An aircraft structure comprising:
a fuselage having an inner skin and an outer skin;
a thermoelectric generator disposed between said inner skin and said outer skin, said thermoelectric generator incorporating at least one operating element having
a cold plate for thermal engagement of the outer skin and
a hot plate for thermal interaction with warmed cabin air internal to the inner skin; and,
a thermoelectric stack of bismuth telluride (Bi2Te3) semiconductor p-n junctions intermediate the cold plate and hot plate for electrical power generation;
said thermoelectric generator further configured to utilize a temperature differential between said inner skin and said outer skin at operating conditions to generate electricity;
an electrical interface configured to provide access to the electricity generated by said thermoelectric generator, said aircraft configured to heat cabin air proximate said interior wall to maintain the temperature; and,
a duct extending from the inner skin providing airflow from the cabin and an exit duct for flow through the outer skin through the duct and wherein the thermal interaction by the hot plate comprises forced convection of cabin air through the heat exchanger employing pressure differential.

4. The aircraft structure as defined in claim 3 further comprising a fan providing airflow from the cabin through the duct.

5. A method for providing electrical power to a device, said method comprising:
heating cabin air proximate an inner skin of an aircraft at operating altitudes to maintain a temperature differential between the inner skin and an outer skin of an aircraft;
flowing air in a duct extending from the inner skin providing airflow from the cabin through a heat exchanger to an exit duct for flow through the outer skin;
generating electricity using a thermoelectric generator between the inner skin and the outer skin with thermal interaction by a hot plate of the thermoelectric generator through forced convection of cabin air through the heat exchanger employing pressure differential and a cold plate of the thermoelectric generator thermally engaged to the outer skin; and,
using the generated electricity to at least partially power a device.

6. The method as defined in claim 5 further comprising conditioning power generated by the thermoelectric generator for use by the device.

7. The method as defined in claim 5 further comprising operating a fan to provide airflow from the cabin through the duct.

8. A thermoelectric generator comprising;
a cold plate for thermal engagement of an outer skin of an aircraft;
a hot plate for thermal interaction with warmed cabin air internal to an inner skin of the aircraft;
a thermoelectric stack intermediate the cold plate and hot plate for electrical power generation;
a duct extending from the inner skin providing airflow from the cabin employing pressure differential;
a heat exchanger in conductive connection with the hot plate and connected to the duct wherein the thermal interaction by the hot plate comprises natural convection of cabin air through the heat exchanger;
an exit duct from the heat exchanger through the outer skin; and, an electrical interface for providing access to the electricity generated by said thermoelectric generator.

* * * * *